United States Patent [19]

Hogan et al.

[11] Patent Number: 5,294,459
[45] Date of Patent: Mar. 15, 1994

[54] AIR ASSISTED APPARATUS AND METHOD FOR SELECTIVE COATING

[75] Inventors: Patrick T. Hogan, Lorain, Ohio; Bernard J. McHugh, Bloomsburg, Pa.; James J. Turner, Amherst, Ohio; Takaji Shimada, Saitama; Tsuyoshi Nishimura, Tokyo, both of Japan; Bradley N. Stoops, Bay Village, Ohio

[73] Assignee: Nordson Corporation, Westlake, Ohio

[21] Appl. No.: 935,943

[22] Filed: Aug. 27, 1992

[51] Int. Cl.⁵ .............................. B05D 1/02
[52] U.S. Cl. ...................... 427/96; 427/421; 427/422; 427/427; 239/8; 239/291; 239/295; 239/296; 239/297
[58] Field of Search ............ 427/421, 427, 422, 96; 239/8, 291, 292, 293, 294, 295, 296, 297, 298, 299, 300

[56] References Cited

U.S. PATENT DOCUMENTS

| | | | |
|---|---|---|---|
| 3,635,400 | 1/1972 | Nord et al. | 239/15 |
| 3,843,052 | 10/1974 | Cowan | 239/3 |
| 4,228,957 | 10/1980 | Davini | 239/300 |
| 4,273,287 | 6/1981 | Huber | 239/299 |
| 4,527,507 | 7/1985 | Sawai et al. | 118/314 |
| 4,880,663 | 11/1989 | Shimada | 427/96 |
| 5,141,165 | 8/1992 | Sharpless et al. | 239/752 |
| 5,143,680 | 9/1992 | Molnar et al. | 264/511 |
| 5,183,322 | 2/1993 | Haruch | 239/394 |

FOREIGN PATENT DOCUMENTS

0379339  1/1990  European Pat. Off. .

Primary Examiner—Terry J. Owens
Assistant Examiner—David M. Maiorana
Attorney, Agent, or Firm—Howard M. Cohn

[57] ABSTRACT

Apparatus and methods for spray coating selected areas of a circuit board with an insulative coating material without coating regions of the circuit board to be left uncoated. A liquid spray device emits the coating material and an air assist attachment connected to the liquid spray device directs jets of air into impinging relation with the coating material emitted therefrom to transform the coating material into an atomized, shaped spray pattern for coating the selected areas. The air assist attachment can be disabled so that the spray device transforms the coating material into a non-atomized, shaped spray pattern for coating selected areas without coating regions of the circuit board to be left uncoated.

19 Claims, 6 Drawing Sheets

AIR ASSISTED APPARATUS AND METHOD FOR SELECTIVE COATING

FIELD OF THE INVENTION

This invention relates to the coating of moisture proof, insulative material on printed circuit boards to protect the circuit boards from moisture, electric leakage and dust. More particularly, the invention relates to an improved method and apparatus for selectively applying a high viscosity, insulative coating material as either an atomized spray or a non-atomized spray so as to coat only desired regions of the circuit board while avoiding deposit of coating material on regions to be left uncoated.

BACKGROUND OF THE INVENTION

Typically, printed circuit boards that require protection from moisture, electric leakage and dust are coated with moisture proof insulative films, known as conformal coatings, such as, acrylic, polyurethane, silicone or epoxy synthetic resins dissolved in a volatile solvent. One conformal coating found satisfactory is available from Humiseal Division, Columbia Chase Corp., Woodside, N.Y., under the trademark "HumiSeal 1B31". When applied to clean circuit boards, an insulative resin film of uniform thickness and without pinholes, is formed as the solvent evaporates.

In the past, five principal methods have been used to apply coatings of moisture proof, insulative material to printed circuit boards. These included the following:

(a) The immersion method, in which packaged circuit boards are immersed in an immersion tank containing the moistureproof insulative material.

(b) The brush-coating method, in which the moisture proof insulative material is applied by a brush to the printed circuit board surface to be coated.

(c) The roller method, in which a sheep's wool roll impregnated with the moisture proof insulative material is rolled on the surface of the printed circuit board to provide the insulative coating thereon.

(d) The spray method, in which the moisture proof insulative material is applied to the printed circuit board by spraying techniques.

(e) The slit die method, in which the moisture proof insulative material is pressurized and extruded from a slit die to eject a film for coating the printed circuit board surface.

Each of the foregoing methods have certain advantages and disadvantages. For example, all methods except brush-coating and certain spraying techniques require masking for those parts and regions on the circuit board to be left uncoated. The masking operations, that is, mounting and removal of the masks, must be done manually, causing a bottleneck in the mass production process. Brush-coating, while not requiring masking, is labor intensive, and otherwise unsuitable for mass production.

Spraying is the most commonly used insulative coating method employed in mass production. Spraying can be categorized as either air spraying in which an air stream is impinged against the stream of liquid coating material after leaving the spray nozzle to atomize it, and airless spraying in which the coating material is dispensed in a low pressure, unatomized flat film pattern, as is disclosed in U.S. Pat. No. 4,880,663, assigned to Nordson Corp., which is hereby incorporated by reference in its entirety.

With air spraying of conformal material onto a circuit board, the air, at a pressure of generally about 30 to 40 pounds per square inch (psi), is projected in the form of opposed air jets against a stream of liquid conformal coating material which is dispensed at a pressure of generally about 20 to 100 psi from a spray nozzle. The required pressures are dependent upon a number of factors including the viscosity of the conformal coating material, the temperature of the conformal coating material and the size of the nozzle. With air spraying, a high flow rate results in thick coatings, which are undesirable, and relatively uncontrolled spray patterns requiring hand masking of components which are to be free of spray, prior to spraying. For these reasons, air spraying is not particularly suitable for modern, automated production facilities.

In airless spraying of conformal coating material, as described in the U.S. Pat. No. 4,880,663 patent, the coating material is sprayed onto a printed circuit board in a flat unatomized pattern. Relative movement is effected between the nozzle and the circuit board in a direction transverse to the plane of the flat pattern discharged from the nozzle. The supply of coating material to the nozzle is intermittently interrupted so as to prevent a deposit of liquid coating on regions of the printed circuit board and/or circuit components which are left to be uncoated. Airless spray coating of conformal coatings on printed circuit boards by this technique, however, was typically accomplished with solvent based, lower viscosity (under about 60 centipoise) coating materials. When these materials were applied at a pressure of about 20 to 30 pounds per square inch (psi), a high quality coating was achieved. A high quality coating is typically characterized by a relatively uniform thickness and an absence of overspray and liquid splatter.

Recently, because of environmental concerns, there has been a trend to reduce or eliminate the use of solvents, previously used to lower the viscosity of the otherwise high viscosity, i.e., above about 60 centipoise (cps), coating materials. To apply a high viscosity conformal material with the described airless technique, a higher application pressure (generally above about 100 psi) is required to drive the viscous material through the nozzle and cause it to form the desired film pattern. These higher pressures, however, cause a higher flow rate and result in a thicker coating (typically above about 7 mils) on the circuit board. Because of the high cost for conformal material and industry standards requiring a coating thickness of preferably about 1 to 3 mils for urethanes, acrylics and epoxies and about 2-8 mils for silicones, simply applying these low solvent coatings at a higher pressure is unsatisfactory.

OBJECTS AND SUMMARY OF THE INVENTION

It is an object of the present invention to provide apparatus and methods for coating printed circuit boards with a thin, relatively uniform, insulative coating material emitted from an airless nozzle which include auxiliary air assist spray jets to obviate the problems and limitations of the prior art systems.

It is a further object of the present invention to provide apparatus and methods for coating printed circuit boards with a thin, relatively uniform insulative coating material of high viscosity, coating material sprayed from an airless nozzle equipped with axillary air jets having at least two modes of operation.

It is another object of the present invention to provide apparatus and methods for selectively applying liquid, insulative coating materials as either an atomized spray or a non-atomized spray so as to coat only desired regions of the circuit board while avoiding deposit of coating material on regions to be left uncoated.

It is yet another object of the present invention to provide apparatus and methods for selectively applying high viscosity insulative coating materials wherein the axillary air jets are comprised of heated air to produce improved flow and leveling of conformal coating material applied to a circuit board.

In accordance with the invention, a system is set forth for spray coating selected areas of a substrate, such as a circuit board, with a high viscosity, liquid, insulative coating material without coating regions of the substrate to be left uncoated. The system includes a liquid spray device for emitting the liquid, insulative coating material delivered thereto. An air assist attachment connected to the airless, liquid spray device directs jets of air into impinging relation with the liquid coating material emitted from the spray device to transform the liquid coating material into an atomized, shaped spray pattern adapted for coating the selected areas of the substrate. Structure for disabling the air assist attachment causes the airless, liquid spray device to transform the liquid coating material into a non-atomized, shaped film pattern adapted for coating the selected areas without coating regions of the substrate to be left uncoated.

Further, in accordance with the invention, the air assist attachment includes air passageways connected at one end to individual air flow regulators and to an air discharge outlet at the opposite end for transforming a flow of air from each of the air flow regulators into jets of air which are emitted from the air discharge outlet for impinging relation with the liquid coating material emitted from the spray device. Typically, the air jets are impinged on opposite sides of the liquid material being emitted from the spray device to form a conical shaped spray pattern for coating a substrate. However, in one embodiment, only one of the air jets is directed at the side of the liquid material to form an elliptical spray pattern which is able to coat under a component attached to the substrate.

Moreover, the air assist attachment includes means readily varying the size and shape of the air jets to optimize them for different coating materials, and includes structure for heating the jets of air directed at insulative coating material being emitted from the spray device to elevate the temperature of the coating material being formed into an atomized, shaped spray pattern to improve the flow and leveling of the coating material applied to the circuit board.

In accordance with the invention, a mask-free method of spray coating selected areas of a substrate with a high, viscosity, liquid, insulative coating material without coating regions of substrate to be left uncoated, comprises the following steps. The liquid, insulative coating material is emitted from a nozzle. When operating in a first mode, one or more jets of air are directed into impinging relation with the liquid coating material emitted from the nozzle to transform the liquid coating material into an atomized, shaped spray pattern adapted for coating the selected areas of the substrate. When operating in a second mode, the air jets are turned off and the fluid pressure is typically increased to transform the dispensed coating into a non-atomized, shaped film pattern adapted for coating the selected areas without coating the regions of the substrate to be left uncoated.

Further, in accordance with alternate methods of this invention, while operating in the first mode, the coating material may be sprayed as a skewed or elliptical shaped spray pattern, and/or the air jets impacting the spray pattern may be heated.

BRIEF DESCRIPTION OF THE DRAINS

The structure, operation, and advantages of the presently preferred embodiment of the invention will become further apparent upon consideration of the following description taken in conjunction with the accompanying drawings, wherein.

DETAILED DESCRIPTION OF THE INVENTION

Figure 1:
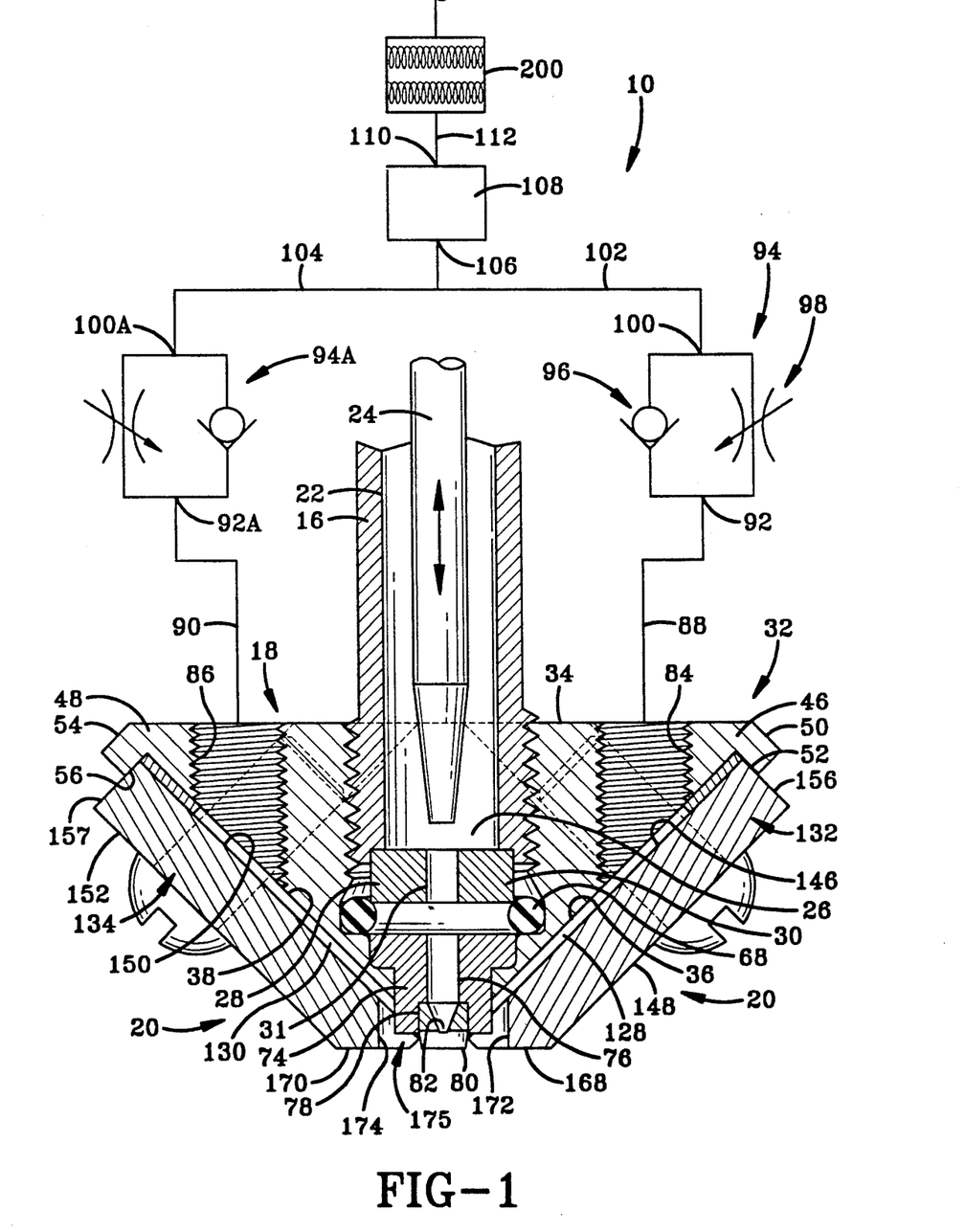
FIG. 1 is a side elevational view, partly in cross section, of a coating system having an airless nozzle with an air assist attachment in accordance with the present invention.

Referring to FIG. 1, a coating system 10 for selectively coating a substrate, typically a circuit board, with a moisture proof, insulative material is illustrated. The coating system 10 includes a spray gun (not shown) having a cylindrical extension 16 with an airless, nozzle assembly 18 and an air assist attachment 20 attached thereto. The overall construction of the coating system 10 including a spray gun, a source of air and a source of coating material forms no part of this invention per se and is described only briefly herein. The nozzle assembly 18 and air assist attachment 20 could be attached, for example, to the threaded end of extension 26 of spray gun 12 of currently pending Ser. No. 07/510,001, filed Apr. 17, 1990, which is hereby incorporated by reference in its entirety.

The cylindrical extension 16 has a throughbore 22 housing a movable valve shaft 24 therein. Throughbore 22 is connected to a source (not shown) of pressurized, conformal coating material 14. As discussed below, the conformal material, such as, acrylic, polyurethane, silicone or epoxy synthetic resins, has a relatively high viscosity of at least about 60 cps and typically between about 60 and 1000 cps. When the coating system 10 is operated exclusively with the air assist attachment activated, the viscosity of coating material which can be effectively applied by means of this invention can reach as high as about 1000 cps. However, when coating system 10 is operated in a dual mode, i.e., with and without the actuation of the air assist attachment, the viscosity of the conformal material which can be satisfactorily applied is limited to a range of between about 60 and 150 cps. The invention is most advantageously used with conformal material which is either solvent free or has a low percentage of solvents. However, it is within the terms of the invention to use the invention with conformal coating material with any typical percentage of solvents, generally known in the industry. It is further within the scope of the invention to spray other types of viscous materials, as desired.

The conformal coating material is introduced into throughbore 22 at one end of extension 16 and flows along the outside of valve shaft 24 and through the outlet end 26 of extension 16. The lower end of valve shaft 24 is preferably tapered and formed to engage a valve seat 28 located in a counterbore 30 formed at the lower end of throughbore 22, adjacent outlet end 26 of extension 16. The valve shaft 24 is movable between an open, retracted position, as shown, in which its lower end disengages valve seat 28 and uncovers a discharge outlet 31 therein, and an extended position in which the lower end engages seat 28 and blocks the discharge outlet 31. This movement of the valve shaft 24 controls the flow of coating material discharged from extension 16 for deposition onto a substrate, such as circuit board 12, as described below.

Figures 2, 2B:
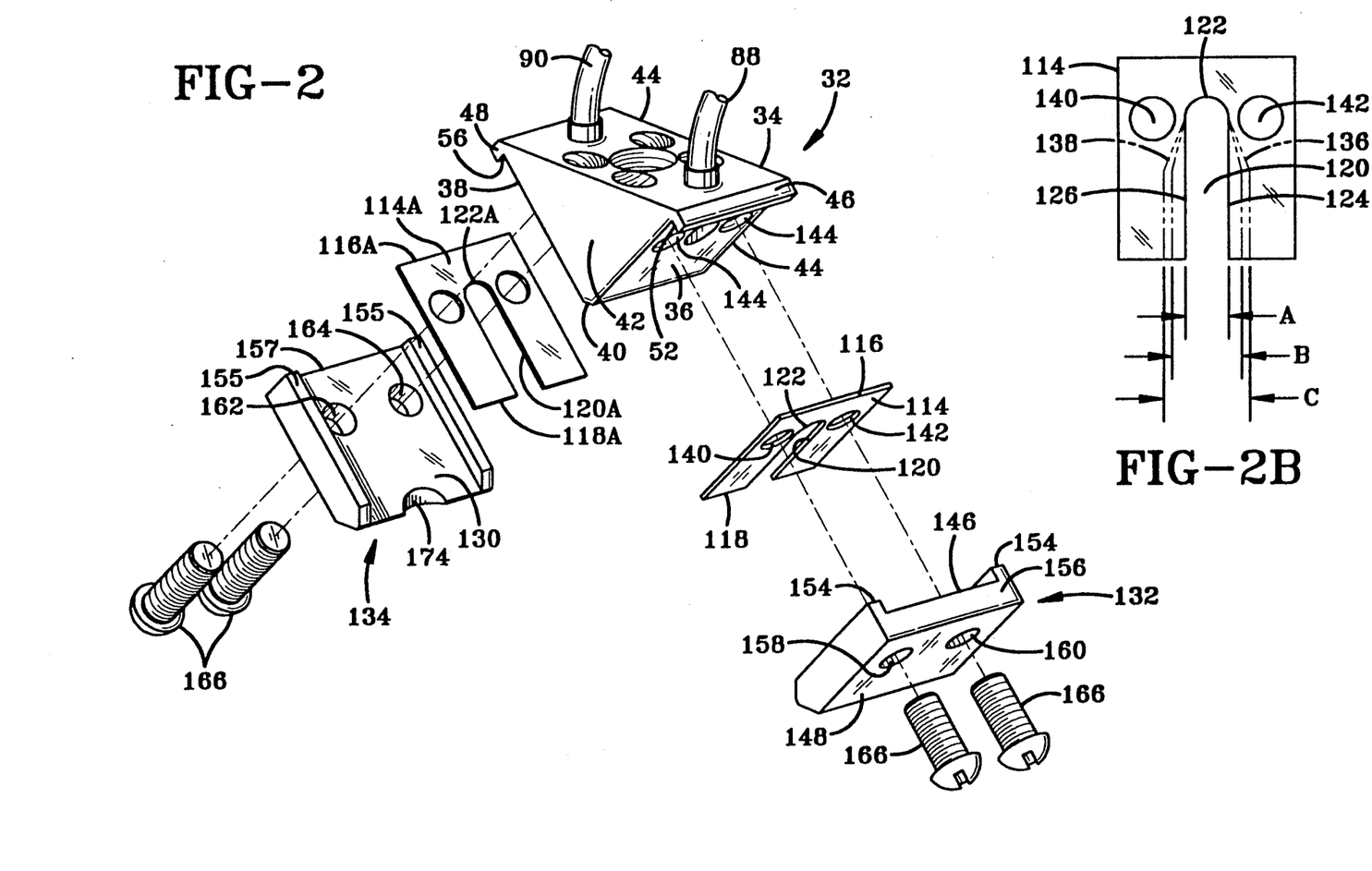
FIG. 2 is an exploded view of the airless, nozzle with the air assist attachment of FIG. 1.
FIG. 2B is a side elevational view of a shim element.

Referring to FIGS. 1 and 2, the airless nozzle assembly 18 includes a nozzle support member 32 which is generally triangular in cross section and threadedly attached to the outlet end 26 of extension 16. Nozzle support member 32 has an upper inlet surface 34 and downward facing, sloped side surfaces 36 and 38, which extend across the width of nozzle member 32. Side surfaces 36 and 38, which are disposed at about a ninety degree angle to each other, intersect upper inlet surface 34 at one end and converge to intersect a narrow outlet surface 40 at the opposite end. Front and rear surfaces 42 and 44 intersect upper inlet surface 34, outlet surface 40, and sloped side surfaces 36 and 38. Two shoulders 46 and 48, which extend outward from sloped side surfaces 36 and 38, have upward and downward facing surfaces 50, 52, 54 and 56, respectively, which are substantially parallel to each other. The upper surfaces 50 and 54 intersect upper inlet surface 34 and are disposed at about a forty five degree angle thereto. The lower surfaces 52 and 56 intersect sloped side surfaces 36 and 38, respectively, and are generally perpendicular thereto.

Figure 2A:
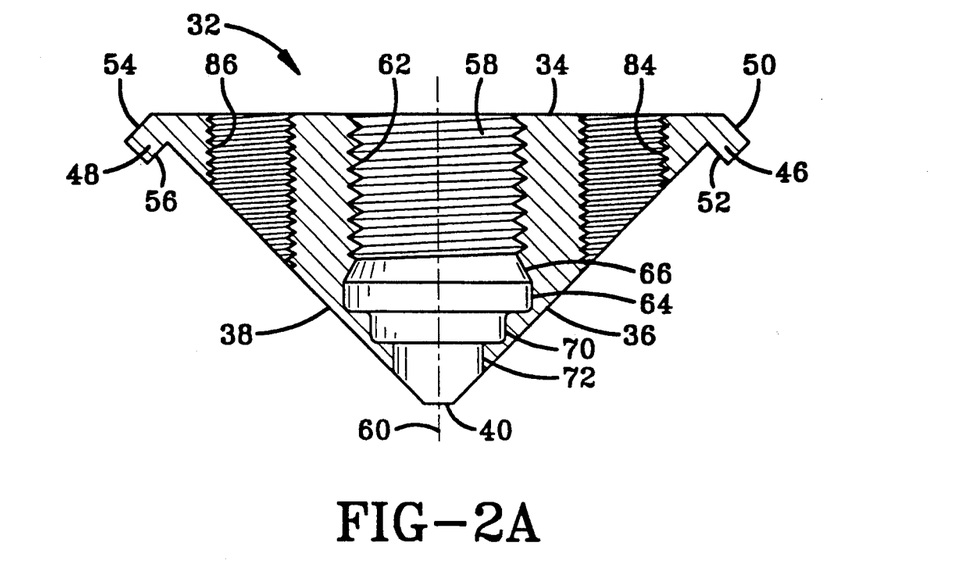
FIG. 2A is a cross sectional view of a nozzle support member.

Nozzle support member 32, as illustrated in FIG. 2A, has a throughbore 58 centered about a vertical centerline 60 that passes through the centers of upper inlet surface 34 and outlet surface 40. Throughbore 58 has an upper, threaded bore section 62 which mates with the external threads on the extension 16. Throughbore 58 has a second bore section 64, below threaded bore section 62 and adjoined thereto by an outwardly sloped frustro-conical surface 66. Second bore section 64, as illustrated in FIG. 1, is adapted to carry a seal 68, such as an O-ring, which engages seat 28 and forms a seal therebetween. Continuing downward towards the outlet surface 40, the throughbore 58 has an inwardly stepped, third bore section 70, intersecting second bore section 64, and an inwardly stepped, fourth bore section 72 intersecting third bore section 70, which together form a mount for a nozzle holder 74. The nozzle holder 74 is formed with a throughbore 76 which is counterbored at the lower end to form a seat 78. A spray nozzle 80, typically brazed within seat 78, has a discharge orifice 82 aligned with the throughbore 76 in nozzle holder 74. Nozzle 80 is preferably a Cross-Cut ® nozzle manufactured by Nordson Corporation of Amherst, Ohio, as shown in U.S. Pat. No. 4,346,849 which is hereby incorporated by reference in its entirety.

A flow path for the coating material is therefore created from the extension 16 to the spray nozzle 80 which includes the throughbore 22 in extension 16, the discharge outlet 31 of valve seat 28, the throughbore 76 in nozzle holder 74 and discharge orifice 82 of nozzle 80, respectively. The flow of coating material through this flow path is controlled by valve shaft 24 moving between a retracted, open position relative to discharge outlet 31 in valve seat 28, and a closed, extended position relative to discharge outlet 31.

A principle feature of this invention is the construction and operation of an air assist attachment 20 which is associated with nozzle support member 32 for directing jets of air into impinging relationship with the coating material being emitted from spray nozzle 80. Referring to FIGS. 1, 2 and 2A, the nozzle support member 32 has two air inlet throughbores 84 and 86 disposed on either side of throughbore 58. Each of the throughbores 84 and 86 have air inlet sections, adjacent the upper inlet surface 34, which are connected to air lines 88 and 90. The latter air lines, in turn, are connected to outlet ports 92 and 92A of skewing means comprising conventional air flow regulators 94 and 94A which are substantially identical and include a check valve 96 and a variable flow restrictor 98 connected in parallel with each other. The inlet ports 100 and 100A are connected by flow lines 102 and 104 to the outlet port 106 of a solenoid actuated valve 108. The inlet port 11 of valve 108 is connected by an air line 112 to a source of pressurized gas, typically air. Opening and closing valve 108 by an external control (not shown), controls the air jets impinging against the coating material being emitted from nozzle support member 32.

Continuing with the structural components of air assist attachment 20, which are assembled with nozzle support member 32, two substantially identical, shim elements 114 and 114A are substantially rectangular in shape and abut against sides 36 and 38. The shim elements are positioned so that their upper edges 116 and 116A abut against the downward facing surfaces 52 and 56 of the shoulders 46 and 48, respectively, and their lower edges 118 and 118A extend generally to the outlet surface 40. Elongated slots 120 and 120A, extending from the lower edges 118 and 118A, terminate in semicircular, upper surfaces 122 and 122A which have a diameter that is substantially equal to the width of the outlet passages of throughbores 84 and 86. When the shim elements are in position, with their upper surfaces abutted against downward facing surfaces 52 and 56, the diameter of the semicircular, upper surfaces 122 and 122A is large enough so as not to block the air flowing from the outlet 0 passages 84 and 86. The opposite sides 124 and 126 of the slots 120 and 120A can be equidistant from each other along their length, as shown in FIG. 2B, and can be disposed substantially perpendicular to the lower edges 118 and 118A of the shim elements.

The size of slots 120 and 120A of the shim elements controls the size and shape of air passageways 128 and 130 between nozzle support member 32 and cap members 132 and 134, as discussed below. Accordingly, as illustrated in FIG. 2B, the width of slot 120, i.e., the distance between the sides 124 and 126 can be increased, from A to B to C by substituting for shims 114,114A, shims having intermediate side sections 136 and 138 which diverge outwardly from the semicircular top of the slots a desired distance and then join the spaced parallel sides of the slots. Thus, the width of the slot can be changed by substituting a shim with a different slot width. Likewise, a shim having a different thickness can be substituted to increase or decrease the size of the air passageways 128 and 130. As the shim element becomes thicker, the volume of the airflow increases and the air velocity decreases. Conversely, as the shim element becomes thinner, the volume of the airflow decreases and the velocity increases. Further, the geometric shape of the slot can be changed to produce different air flow patterns with different shims. Each shim element 114 and 114A includes spaced mounting holes 140 and 142 which align with threaded mounting holes 144 projecting into nozzle support member 32 from sloped surfaces 36 and 38.

Continuing with the structural elements of air assist attachment 20 which are assembled to nozzle support member 32, two substantially identical cap members 132 and 134 are sized and shaped to mount against sloped sides 36 and 38 with a shim element 114 and 114A, respectively, sandwiched therebetween. Each of the cap members 132 and 134 is a generally, rectangular shaped element with substantially flat inner and outer surfaces 146 and 148, 150 and 152, respectively. Shoulders 154 and 155 project outward from the edges of inner surfaces 146 and 150, respectively. The shoulders are spaced from each other so that they engage the front and rear surfaces 42 and 44 of nozzle support member 32 when cap members 132 and 134 are mounted against the sides 36 and 38 with their upper surfaces 156 and 157, respectively, abutted against the downward facing surfaces 52 and 56 of shoulders 46 and 48. Spaced mounting holes 158 and 160, and 162 and 164, in each of the cap members 132 and 134, respectively, align with threaded mounting holes 144 projecting into nozzle support member 32 from the sloped surfaces 36 and 38 and the mounting holes 140 and 142 in the shim elements. The cap members can be secured to the nozzle support member by screws 166.

Figure 3:
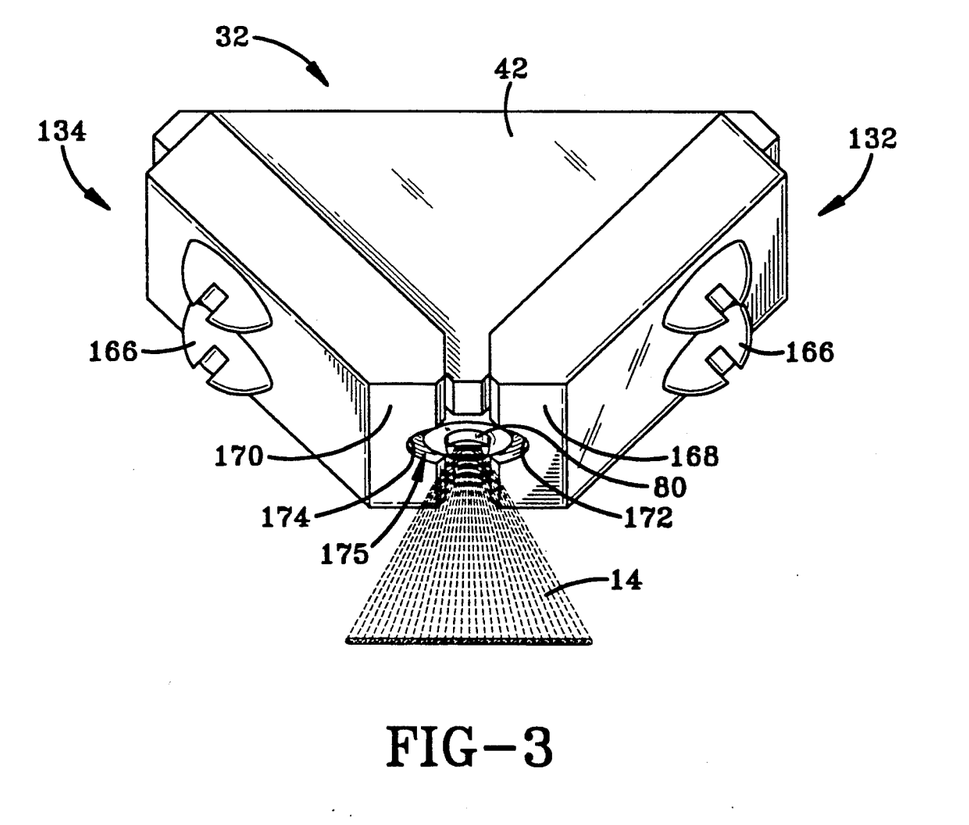
FIG. 3 is a perspective view of an airless nozzle and the flat spray pattern dispensed from the nozzle when the air jets are not activated.
Figure 4:
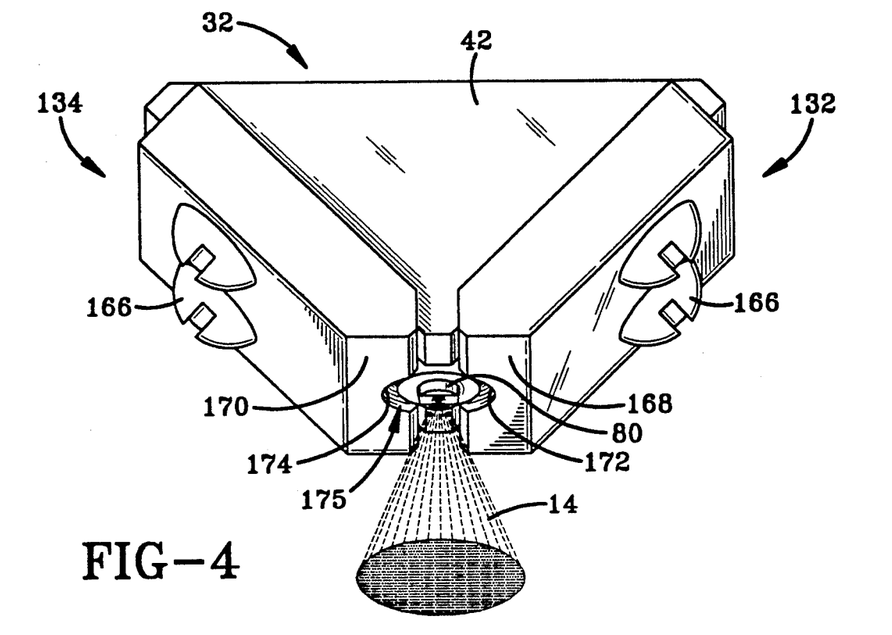
FIG. 4 is a perspective view of an airless nozzle mechanism with an air assist attachment and the conical spray pattern resulting from a discharge of high viscosity, liquid, insulative coating material from the nozzle being impinged upon by jets of air.

As seen most clearly in FIG. 1, the cap members 132 and 134 each have a lower surface 168 and 170 which extends at about a one hundred and thirty five degree angle to outer surfaces 148 and 152, respectively. Semicircular shaped slots 172 and 174, extending between the inner surfaces 146 and 150 and the lower surfaces 168 and 70, are positioned midway across the lower surfaces 168 and 170 and are disposed perpendicular thereto. As seen in FIGS. 3 and 4, the slots are spaced from the nozzle 80 and form an air discharge outlet 175 which shapes the two jets of air issuing forth from the air passageways 128 and 130. The jets of air from semicircular slots 72,174 impact upon the stream of coating material being dispensed from nozzle orifice 82 at low fluid pressures such as 10 psi, for example, to produce the conical pattern of FIG. 4 (later described).

The system 10, typically used for spraying circuit boards 12 with insulative coating material 14, includes an airless nozzle assembly 18 with an air assist attachment 20 having two modes of operation for applying insulative coating material to selective areas of the circuit board without applying the insulative coating material to regions that are to be left uncoated. The two modes of operation are particularly useful where the insulative coating material has a viscosity of over about 60 to about 150 cps, such as is the case with solvent free or low solvent materials in accordance with the trend of reducing the amount of chemical bi-products being released into the environment from manufacturing processes. The operating temperature is normally ambient temperature. Moreover, it is very desirable to apply a high quality, pin hole free, thin coating, such as between 1 and 3 mils, the thickness which is now a standard for different segments of industry.

In the first mode, the air assist attachment 20 ejects jets of air which impinge against the low pressure stream of coating material emitted from nozzle 80 to break the liquid coating material into droplets and form an atomized spray having a generally conical shape, as illustrated in FIG. 4. Using this technique, the thickness of the conformal coating applied to the circuit board is typically in the range of about 1-3 mils. For the coating across the majority of a circuit board, this 10 thickness is well within the desired range. While being effective for general spraying of circuit boards, a small, but noticeable overspray and splatter, produced by the conical spray pattern, prevents the use of air assist attachment 20 when spraying the coating material directly adjacent to a region (typically having an electrical component such as a switch) which is to be left uncoated.

Under these circumstances, the second mode of operation is employed wherein the air assist attachment 20 is disabled. However, since the spray material has a relatively high viscosity, about 60 to about 150 cps, the application pressure for the coating material must be increased to 40 psi, for example, to force the material out of nozzle orifice 82. The result is a non-atomized, essentially planar, fan shaped spray pattern, as illustrated in FIG. 3. This is a splash-free coating which eliminates the need for masking the region to be left uncoated. With increased pressure, however, the thickness of the coating significantly increases to about 5-9 mils or more. While this thickness is not desirable for the entire circuit board, it is acceptable in limited areas, such as the areas directly adjacent the regions to be left uncoated.

It can be appreciated by one skilled in the art that the two mode system of the present invention is adapted for use with one or more spray guns which can be automatically controlled by robots. When an area of a circuit board requires an insulative coating, the first mode is preferably operated because a thinner coating of insulative material is applied. Any resulting overspray from the atomized spray can be simply covered as the one or more spray guns move to spray adjacent areas of the circuit board. However, whenever the area being sprayed is directly next to a region which is to be left uncoated, the system is switched into the second mode whereby a thicker, but splash-free coating is applied. While the coating from the second mode can be thicker than desired, it is typically only applied to a small, confined area and the overall coating process is much more economical.

The operation of system 10 is as follows. In the first mode, when the air assist attachment 20 is operating, the air is first turned on by solenoid actuated valve 108 so that air begins to flow from the source (not shown) and air line 112, through valve 108, into air lines 102 and 104, through the flow regulators 94 and 94A, into air lines 88 and 90, into air inlet throughbores 84 and 86, down the air passageways 128 and 130, and out of air discharge outlet 175. Typically, the air pressure in the first mode is about 20 to about 70 psi and preferably about 25 to about 40 psi. Next, the flow of liquid coating material is initiated by moving valve shaft 24 from an extended, closed position relative to discharge outlet 31 in valve seat 28, to an open, retracted position relative to discharge outlet 31. The liquid coating material now flows from a source (not shown) into throughbore 22 in extension 16, through discharge outlet 31 of valve seat 28, through throughbore 76 in nozzle holder 74 and exits from discharge 82 of nozzle 80. The pressure of the fluid coating material, in the first mode, is about 5 to about 60 psi and preferably between about 10 and 30 psi.

In the first mode of operation, without the air jets impinging on the coating material, the coating material would be discharged from the nozzle 80 as a stream of liquid. However, when the liquid material discharged from the nozzle is impinged from opposing sides by jets of pressurized air from discharge outlet 175, the coating material transforms into an atomized, shaped spray pattern having a generally conical shape, as illustrated in FIG. 4.

Figure 6:
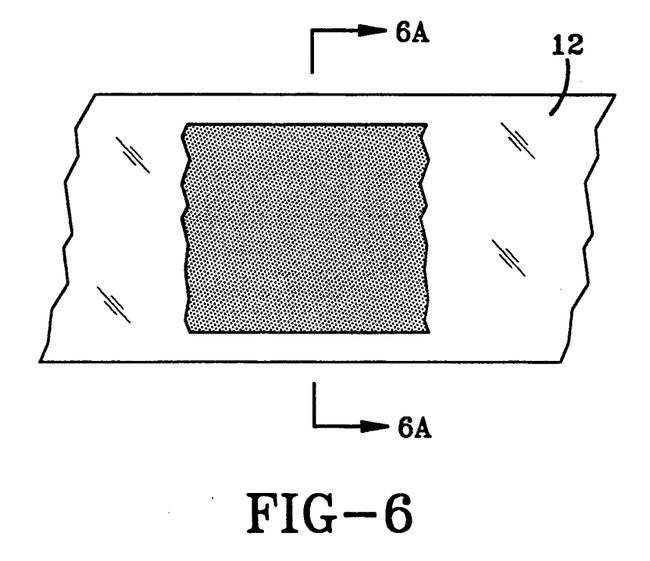
FIG. 6 is a top view of a circuit board having a band of coating material applied as a conical spray pattern by the airless nozzle with the air assist attachment of FIG. 4.
Figure 6A:
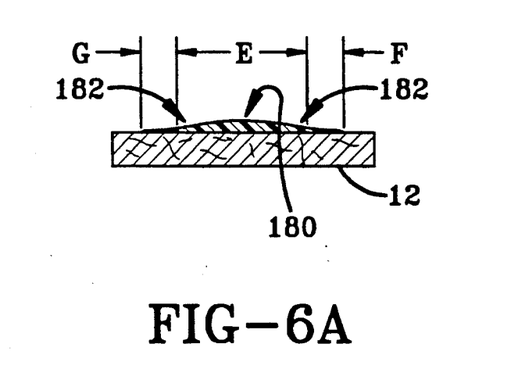
FIG. 6A is a view, in cross section, through line 6A—6A of FIG. 6.

With the nozzle 80 spaced from circuit board 12 a distance of between about 0.25 and 1.0 inches, the conically shaped pattern of atomized coating material is applied to a region of circuit board 12 forming a pattern of conformal material coating, as illustrated in FIG. 6. The resulting cross section of the coating, as illustrated in FIG. 6A, has a central section E which is approximately twice as thick at a center portion 180 as compared with its opposite edge portions 182. The remainder of the sprayed coating, i.e. outer sections F and G, have a very thin coating which is in the category of overspray.

In an exemplary test, the width of the central section E of the spray pattern in FIG. 6A was about 0.375 inches and the width of the outer sections F and G was about 0.09 to about 0.188 inches. When the thickness of the center portion was about 1 mil, the edge portions 182 had a material thickness of about 0.5 mil. Further, the thickness of the material coating in the outer sections F and G was less than 0.5 mil and fell into the category of overspray.

When the spray gets close to a region which cannot be coated, the air assist attachment is turned off and the system is operated in the second mode which produces splash-free coatings on the circuit board. To operate in the second mode, the flow of liquid coating material is first turned off by moving valve shaft 24 from an open, retracted position relative to discharge outlet 31 to an extended, closed position relative to discharge outlet 31 in valve seat 28. Then, the air is turned off by closing solenoid actuated valve 10B so that the air ceases to flow out of air discharge outlet 175. The pressure of the liquid coating material is increased at the source (not shown) to between about 40 and about 60 psi in order for the discharge orifice to transform the liquid coating material into a fan pattern, as discussed below. Next, the liquid coating material is turned on again by moving valve shaft 24 from an extended, closed position relative to discharge outlet 31 in valve seat 28, to an open, retracted position relative to discharge outlet 31, as previously explained. The liquid coating material now flows from a source (not shown) into the throughbore 22 in extension 16, through discharge outlet 31 of valve seat 28, through throughbore 76 in nozzle holder 74 and out of discharge orifice 82 of nozzle 80. The result is a transformation of the coating material being emitted from nozzle 80 into a non-atomized, planar, fan shaped film pattern, as seen in FIG. 3.

Figure 5:
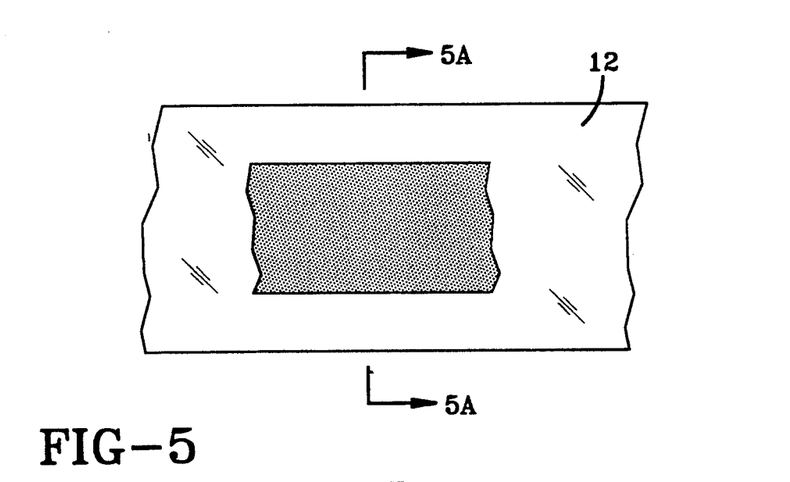
FIG. 5 is a top view of a circuit board having a band of coating material applied as a flat spray pattern by the airless nozzle of FIG. 3.
Figure 5A:
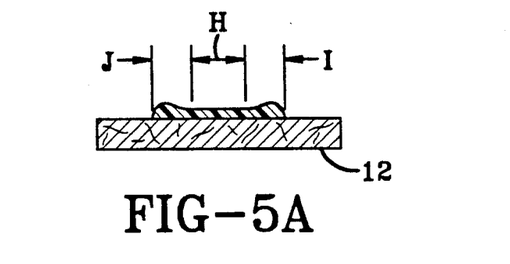
FIG. 5A is a view, in cross section, through line 5A—5A of FIG. 5.

The resulting non-atomized, planar, fan shaped film pattern of coating material is applied to an area on a circuit board 12, as illustrated in FIG. 5. With the nozzle spaced from the circuit board a distance of between about 0.25 and 1.0 inches, a leaf or fan shaped film pattern, as shown in FIG. 3, provides splash-free results. The resulting cross section of the coating, as illustrated in FIG. 5A, has a central section H which is approximately one half as thick as the outer sections I and J. For example, if the thickness of the center section is about 2 mils, the outer sections would have a material thickness of about 5 mils.

Figure 7:
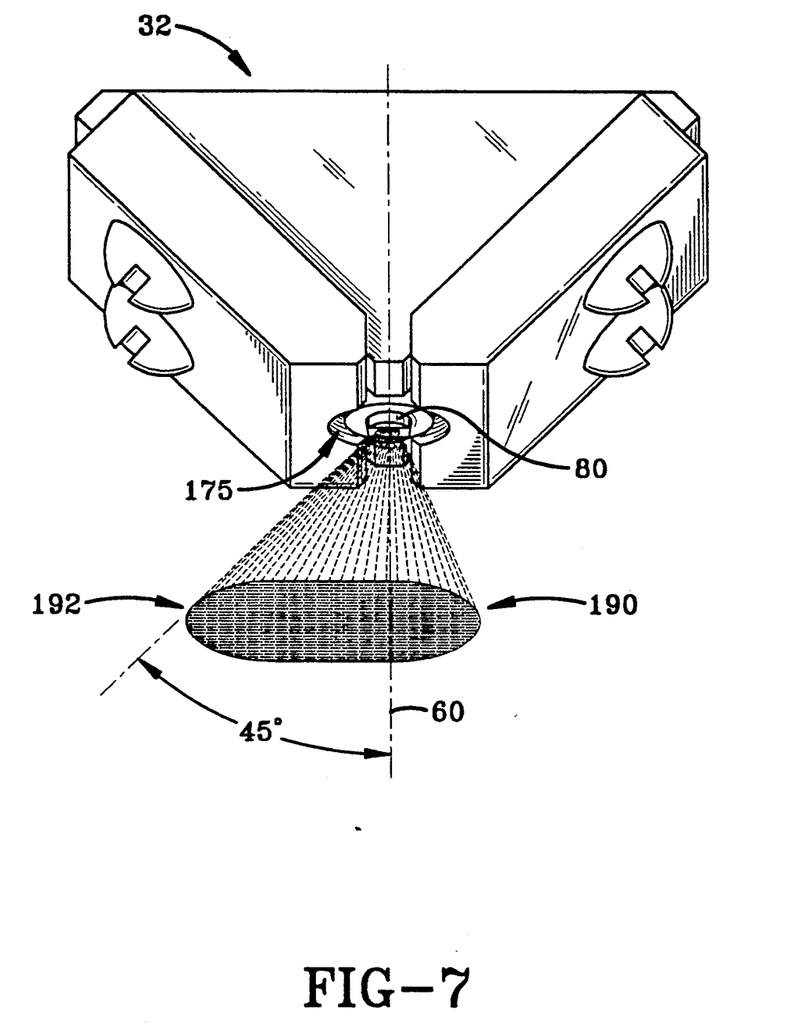
FIG. 7 is a perspective view of an airless nozzle with an air assist attachment and the elliptical spray pattern resulting from the impingement on the coating 10 material of only one air jet from one side of the nozzle.

While the first mode has been described as operating with air jets impinging on opposing sides of the coating material discharged from nozzle 80, it is also within the scope of the invention to operate with an air jet directed from only one of the air passageways, either 128 or 130. For example, if regulator 94A is closed so that the air jet were to come solely from air passageway 128 to the right side of discharge outlet 175, the liquid coating material emitted from nozzle 80 would break into droplets which form an atomized spray having a skewed, generally elliptical shape, as illustrated in FIG. 7. The side of the spray opposite from where the air jet impinges has an angle of about 45 degrees with a centerline 60 extending through nozzle 80. The thickness of the coating being applied by the spray gets progressively thinner from the region 190 closest to where the air jet impinges the liquid emitted from nozzle 80 to the region 192 furthermost from the air jet impingement. The region 192 is particularly advantageous to spray coating material under components which might not otherwise get sprayed by the conical shaped pattern. Thus, using this skewing technique, the spray gun hardware previously associated with tilting the spray nozzle to spray under a component can be eliminated for some applications. It is also within the terms of the invention to adjust the balance of air through air 10 passageways 128 and 130 so that the shape of the elliptical spray can be controlled depending upon the specific application. The control of the air flow to the air passageways can be easily regulated by adjusting the flow regulators 94 and 94A.

While the first mode using an air assist attachment has been described as operating with a coating material having a viscosity of about 60 to about 150 cps, it is also within the scope of the invention to use the air assist attachment with much higher viscosity, liquid coating materials in the range of about 150 cps to about 1000 cps. Under these conditions, the pressure of the air discharged from the air assist attachment is increased to between about 30 psi and 75 psi. Concurrently, the pressure of the coating material is increased to between about 30 and 60 psi. However, with coating materials having a viscosity above about 150 cps, the second mode of operation, without impinging air jets against the coating material being discharged, is not effective because of the extremely high liquid pressure needed to form a non-atomized, planar, fan shaped film pattern. The high pressure would form a coating of material which is generally too thick for the spraying operations contemplated with the present invention. Therefore, with this range of coating material, the invention is generally used exclusively in its first mode of operation.

While the above described embodiments of the invention provides a very effective means of coating a with a liquid, insulative coating material without coating regions of the substate to be left uncoated, it is also within the terms of the invention to provide an alternative embodiment wherein a heating device 200 is located in the airline 112 providing air through the air valve 108 to the air regulators 94 and 94A, as previously discussed. As illustrated in FIG. 1, the heating device 200 can be any conventional heater which can elevate the temperature of the air from room temperature to about 180 degrees fahrenheit. Typically, the coating material has a maximum heating temperature of about 150 degrees fahrenheit. However, as coating material, even if previously heated, flows through the spray device 10 and onto the circuit board, it rapidly looses heat. By impinging jets of heated air onto the coating material dispensed from the spray nozzle, the temperature of the coating material can be maintained until it contacts the circuit board. The heated coating material provides a more predictable, stable, generally conical film pattern because changes in the temperatures of the air and coating material do not generally fluctuate as the ambient temperature changes. Also, in the case where the coating material includes a solvent, the higher temperature causes a higher percentage of solvent release from the coating material, and thus, accelerated evaporation of the solvent occurs. Further, the heated air maintains an elevated temperature in the coating material once it is applied to the board for a longer period of time which encourages the flow of coating material and leveling of the coating material once it is on the circuit board.

While the present invention has been described with reference to using jets of air, it is also within the terms of the invention to use any type of desired gas.

It is apparent that there has been provided in accordance with this invention apparatus and methods for spraying a coating of high viscosity, insulative coating material on selected areas of a circuit board without coating regions of the circuit board to be left uncoated that satisfy the objects, means and advantages set forth hereinbefore. In one mode of operation, the apparatus and method spray an atomized coating of the material on selected areas where overspray is not a significant concern while in a second mode, the apparatus and method spray a non-atomized coating of the material on selected areas where overspray cannot be tolerated. Other alternate methods involving skewing of the spray pattern and heating of the air jets are also disclosed.

While the invention has been described in combination with embodiments thereof, it is evident that many alternatives, modifications, and variations will be apparent to those skilled in the art in light of the foregoing description. Accordingly, the invention is intended to embrace all such alternatives, modifications and variations as fall within the spirit and broad scope of the appended claims.

We claim:

1. A mask-free method of coating selected areas of a circuit board with a liquid coating material without coating regions of said circuit board to be left uncoated, comprising the steps of:

emitting said liquid coating material as a nonatomized liquid from a liquid spray device;

operating in a first mode by directing jets of air into impinging relation with said liquid coating material emitted from said liquid spray device as a stream of liquid coating material to transform said stream of liquid coating material into an atomized, shaped spray pattern adapted for coating certain of said selected areas of said circuit board; and operating in a second mode wherein said liquid coating material is emitted from said liquid spray device as a nonatomized, liquid film having a shaped film pattern adapted for coating certain of said selected areas with said liquid film without coating said regions of said circuit board to be left uncoated.

2. The method of claim 1 wherein the stap of operating in the first mode comprises the steps of emitting said coating material from said liquid spray device at a first pressure as said stream of liquid coating material and directing said jets of air into impinging relation with said stream of liquid coating material to transform said stream of liquid coating material into an atomized, essentially conical shaped spray pattern.

3. The method of claim 1 wherein the step of operating in the second mode comprises the step of emitting said coating material from said liquid spray device at a second pressure higher than said first pressure whereby said coating material is sprayed from said liquid spray device as a nonatomized, essentially planar, fan shaped spray pattern.

4. The method of claim 3 including the step of selecting said coating material having a viscosity of over about 60 cps.

5. The method of claim 4 including the step of selecting said coating material having a viscosity of between about 60 and 150 cps.

6. The method of claim 4 including the step of delivering said liquid coating material to said liquid spray device at a first pressure of about 5 to about 60 psi.

7. The method of claim 6 including the step of delivering said liquid coating material to said liquid spray device at a first pressure of about 10 to about 30 ps.

8. The method of claim 1 including when operating in said first mode the step of directing said jets of air against said liquid coating in an unbalanced manner to skew said shaped spray pattern of atomized coating material.

9. The method of claim 1 including when operating in said first mode the step of regulating the flow of air forming said jets of air directed against said liquid coating material emitted from said liquid spray device.

10. The method of claim 1 comprising the additional step of operating in a third mode wherein said jets of air are directed against said liquid coating material in an unbalanced manner t skew said shaped spray pattern of atomized coating material for coating under one or more components supported on said circuit board.

11. The method of claim 9 including the step of providing said flow of air at a pressure of about 20 to about 70 psi.

12. The method of claim 11 including the step of providing said flow of air at a pressure of about 25 to about 40 psi.

13. The method of claim 1 including when operating in said first mode the step of heating a flow of air forming said jets of air directed against said liquid coating material being emitted from said spray device.

14. The method of claim 1 wherein said coating material is an electrically insulative coating material.

15. The method of claim 6 including the step of delivering said liquid coating material to said liquid spray device at a second pressure of about 40 to about 60 psi.

16. A mask-free method of spray coating selected areas of a substrate with a liquid coating material without coating regions of said substrate to be left uncoated, comprising the steps of:

emitting said liquid coating material as a nonatomized liquid from a liquid spray device;

operating in a first mode by directing jets of air into impinging relation with said liquid coating material emitted from said liquid spray device as a stream of liquid coating material to transform said stream of liquid coating material into an atomized skewed spray pattern adapted for coating certain of said selected areas of said substrate; and operating in a second mode wherein said liquid coating material is emitted from said liquid spray device as a nonatomized, liquid film having a shaped film pattern adapted for coating said selected areas with said liquid film without coating said regions of said substrate to be left uncoated.

17. The method of claim 16 including the step of selecting said coating material having a viscosity of between about 60 and 150 cps.

18. The method of claim 16 including the step of delivering said liquid coating material to said liquid spray device while operating in said first mode at a first pressure of about 5 to about 60 psi.

19. The method of claim 18 including the step of delivering said liquid coating material to said liquid spray device while operating in said second mode at a second pressure higher than said first pressure, said second pressure being in the range of about 40 to about 60 psi.

* * * * *